United States Patent
Song

(10) Patent No.: US 8,373,152 B2
(45) Date of Patent: Feb. 12, 2013

(54) LIGHT-EMITTING ELEMENT AND A PRODUCTION METHOD THEREFOR

(75) Inventor: June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 157 days.

(21) Appl. No.: 12/934,057

(22) PCT Filed: Mar. 27, 2009

(86) PCT No.: PCT/KR2009/001582
§ 371 (c)(1),
(2), (4) Date: Nov. 16, 2010

(87) PCT Pub. No.: WO2009/120044
PCT Pub. Date: Oct. 1, 2009

(65) Prior Publication Data
US 2011/0062412 A1    Mar. 17, 2011

(30) Foreign Application Priority Data

Mar. 27, 2008  (KR) .................. 10-2008-0028669
Mar. 28, 2008  (KR) .................. 10-2008-0028882

(51) Int. Cl.
*H01L 29/06* (2006.01)
(52) U.S. Cl. .............. 257/13; 257/99; 257/E33.066; 257/E33.008
(58) Field of Classification Search .......... 257/13, 257/99, E33.066, E33.008
See application file for complete search history.

(56) References Cited

U.S. PATENT DOCUMENTS

| | | | | | |
|---|---|---|---|---|---|
| 4,712,219 | A | * | 12/1987 | Yano et al. | 372/45.012 |
| 5,058,120 | A | * | 10/1991 | Nitta et al. | 372/46.01 |
| 5,268,328 | A | * | 12/1993 | Mori et al. | 438/43 |
| 5,360,762 | A | * | 11/1994 | Takahashi et al. | 438/44 |
| 5,436,923 | A | * | 7/1995 | Nagai | 372/46.01 |
| 5,583,881 | A | * | 12/1996 | Uchida et al. | 372/49.01 |
| 5,734,670 | A | * | 3/1998 | Ono et al. | 372/45.012 |
| 5,742,629 | A | * | 4/1998 | Nishikawa et al. | 372/46.01 |
| 5,812,578 | A | * | 9/1998 | Schemmann et al. | 372/43.01 |
| 5,814,839 | A | * | 9/1998 | Hosoba | 257/96 |
| 5,822,350 | A | * | 10/1998 | Nishimura et al. | 372/46.01 |
| 5,956,361 | A | * | 9/1999 | Ikeda et al. | 372/46.01 |
| 6,009,112 | A | * | 12/1999 | Uchida | 372/46.01 |
| 6,044,099 | A | * | 3/2000 | Shono et al. | 372/46.014 |

(Continued)

FOREIGN PATENT DOCUMENTS

KR      10-0723150 B1    5/2007
KR  10-2008-0018084 A    2/2008

*Primary Examiner* — N Drew Richards
*Assistant Examiner* — Ankush Singal
(74) *Attorney, Agent, or Firm* — Birch, Stewart, Kolach & Birch, LLP

(57) ABSTRACT

A light emitting element according to an exemplary embodiment includes: a support substrate; a second electrode layer formed on the support substrate; a current spreading layer formed on the support substrate; a second conductive semiconductor layer formed on the second electrode layer and the current spreading layer; an active layer formed on the second conductive semiconductor layer; a first conductive semiconductor layer formed on the active layer; and a first electrode layer formed on the first conductive semiconductor layer.

16 Claims, 8 Drawing Sheets

U.S. PATENT DOCUMENTS

| | | | |
|---|---|---|---|
| 6,084,899 A * | 7/2000 | Shakuda | 372/45.01 |
| 6,233,266 B1 * | 5/2001 | Kawasumi | 372/46.01 |
| 6,242,764 B1 * | 6/2001 | Ohba et al. | 257/190 |
| 6,285,698 B1 * | 9/2001 | Romano et al. | 372/46.01 |
| 6,298,079 B1 * | 10/2001 | Tanaka et al. | 372/46.01 |
| 6,329,667 B1 * | 12/2001 | Ota et al. | 257/13 |
| 6,486,500 B1 * | 11/2002 | Chen | 257/99 |
| 6,555,846 B1 * | 4/2003 | Watanabe et al. | 257/94 |
| 6,597,716 B1 * | 7/2003 | Takatani | 372/46.01 |
| 6,618,416 B1 * | 9/2003 | Taneya et al. | 372/46.01 |
| 6,791,117 B2 * | 9/2004 | Yoshitake et al. | 257/94 |
| 6,794,688 B2 * | 9/2004 | Nakatsu et al. | 257/98 |
| 6,822,989 B1 * | 11/2004 | Fukuhisa et al. | 372/43.01 |
| 6,900,473 B2 * | 5/2005 | Yoshitake et al. | 257/95 |
| 6,979,842 B2 * | 12/2005 | Stein et al. | 257/79 |
| 7,023,020 B2 * | 4/2006 | Uemura | 257/94 |
| 7,027,474 B2 * | 4/2006 | Ohkubo | 372/46.016 |
| 7,042,011 B2 * | 5/2006 | Takatani | 257/78 |
| 7,164,701 B2 * | 1/2007 | Tanaka et al. | 372/45.01 |
| 7,402,843 B2 * | 7/2008 | Onishi | 257/189 |
| 7,450,622 B2 * | 11/2008 | Hata et al. | 372/46.01 |
| 7,479,400 B2 * | 1/2009 | Kawato | 438/40 |
| 7,514,720 B2 * | 4/2009 | Kim et al. | 257/90 |
| 7,728,340 B2 * | 6/2010 | Unno et al. | 257/98 |
| 7,759,670 B2 * | 7/2010 | Liu et al. | 257/13 |
| 7,777,242 B2 * | 8/2010 | Yoneda | 257/98 |
| 8,163,577 B2 * | 4/2012 | Emerson et al. | 438/22 |
| 2003/0132445 A1 * | 7/2003 | Yoshitake et al. | 257/84 |
| 2004/0135166 A1 * | 7/2004 | Yamada et al. | 257/103 |
| 2004/0256629 A1 * | 12/2004 | Stein et al. | 257/98 |
| 2005/0017254 A1 * | 1/2005 | Lin et al. | 257/81 |
| 2005/0045906 A1 * | 3/2005 | Tu et al. | 257/103 |
| 2005/0184300 A1 * | 8/2005 | Tazima et al. | 257/94 |
| 2005/0236632 A1 * | 10/2005 | Lai et al. | 257/94 |
| 2005/0279994 A1 * | 12/2005 | Ueda et al. | 257/33 |
| 2006/0094141 A1 * | 5/2006 | Tsunoda et al. | 438/22 |
| 2006/0097273 A1 * | 5/2006 | Wu et al. | 257/97 |
| 2006/0273335 A1 * | 12/2006 | Asahara et al. | 257/98 |
| 2007/0114545 A1 * | 5/2007 | Jang et al. | 257/94 |
| 2007/0126021 A1 * | 6/2007 | Ryu et al. | 257/103 |
| 2007/0145381 A1 * | 6/2007 | Unno et al. | 257/79 |
| 2007/0145391 A1 | 6/2007 | Baik et al. | |
| 2008/0048206 A1 | 2/2008 | Lee et al. | |
| 2008/0265267 A1 * | 10/2008 | Unno | 257/98 |
| 2009/0072257 A1 * | 3/2009 | Unno et al. | 257/98 |
| 2009/0200686 A1 * | 8/2009 | Tsang et al. | 257/784 |
| 2011/0101304 A1 * | 5/2011 | Song | 257/13 |

* cited by examiner

LIGHT-EMITTING ELEMENT AND A PRODUCTION METHOD THEREFOR

TECHNICAL FIELD

The present invention relates to a light emitting element and a manufacturing method thereof.

BACKGROUND ART

In recent years, as a light emitting element, a light emitting diode (LED) has widely been used. Since the light emitting diode converts electric energy into light energy and has high efficiency and a long lifespan of 5 years or longer, it is possible to remarkedly reduce energy consumption and save maintenance cost, as a result, it has widely been in a next-generation lighting field.

The light emitting diode includes a first conductive semiconductor layer, an active layer, and a second conductive semiconductor layer. Light is generated from the active layer depending on current applied through the first conductive semiconductor layer and the second conductive semiconductor layer.

Meanwhile, the light emitting diode may be classified into a lateral-type light emitting diode and a vertical-type light emitting diode.

In the lateral-type light emitting diode, the first conductive semiconductor layer, the active layer, and the second conductive semiconductor layer are formed on a growth substrate and the second conductive semiconductor layer, the active layer, and the first conductive semiconductor layer are partially removed to partially expose the first conductive semiconductor layer in order to form an electrode layer. Therefore, an emission area is reduced to thereby deteriorate light efficiency.

Further, in the lateral-type light emitting diode, since the first conductive semiconductor layer, the active layer, and the second conductive semiconductor layer are disposed on the growth substrate, it is difficult to discharge heat due to the growth substrate having low thermal conductivity.

Further, in the lateral-type light emitting diode, since the first conductive semiconductor layer, the active layer, and the second conductive semiconductor layer are disposed on the growth substrate, it is difficult to discharge heat due to the growth substrate having low thermal conductivity.

On the contrary, in the vertical-type light emitting diode, since a first electrode layer is formed on the first conductive semiconductor layer and a second electrode layer is formed below the second conductive semiconductor layer, the active layer needs not to be removed in order to form the electrode layer, as a result, the emission area is not reduced. Accordingly, light efficiency may be improved as compared to the lateral-type light emitting diode.

Further, in the vertical-type light emitting diode, since heat is transferred through the second electrode layer, the heat is easily discharged.

Meanwhile, in the vertical-type light emitting diode, a large area is increased by allowing current that flows between the first electrode layer and the second electrode layer so as to increase the light efficiency.

DISCLOSURE

Technical Problem

An embodiment provides a light emitting element having a new structure and a manufacturing method thereof.

An embodiment provides a light emitting element having improved light efficiency and a manufacturing method thereof.

Technical Solution

A light emitting element according to an exemplary embodiment includes: a support substrate; a second electrode layer formed on the support substrate; a current spreading layer formed on the support substrate; a second conductive semiconductor layer formed on the second electrode layer and the current spreading layer; an active layer formed on the second conductive semiconductor layer; a first conductive semiconductor layer formed on the active layer; and a first electrode layer formed on the first conductive semiconductor layer.

A manufacturing method of a light emitting element according to an exemplary embodiment includes: forming a first conductive semiconductor layer, an active layer, a second conductive semiconductor layer, and a current spreading layer on a growth substrate; forming an etch groove to partially expose the second conductive semiconductor layer by selectively removing the current spreading layer and the second conductive semiconductor layer; forming a second electrode layer on the etch groove and the current spreading layer; forming a support substrate on a temporary substrate; forming a composite by bonding the second electrode layer and the support substrate to each other with a wafer bonding layer interposed therebetween; removing the growth substrate and forming a first electrode layer on the first conductive semiconductor layer; and removing the temporary substrate.

Advantageous Effects

An embodiment may provide a light emitting element having a new structure and a manufacturing method thereof.

An embodiment may provide a light emitting element having improved light efficiency and a manufacturing method thereof.

MODE FOR INVENTION

Figure 1:
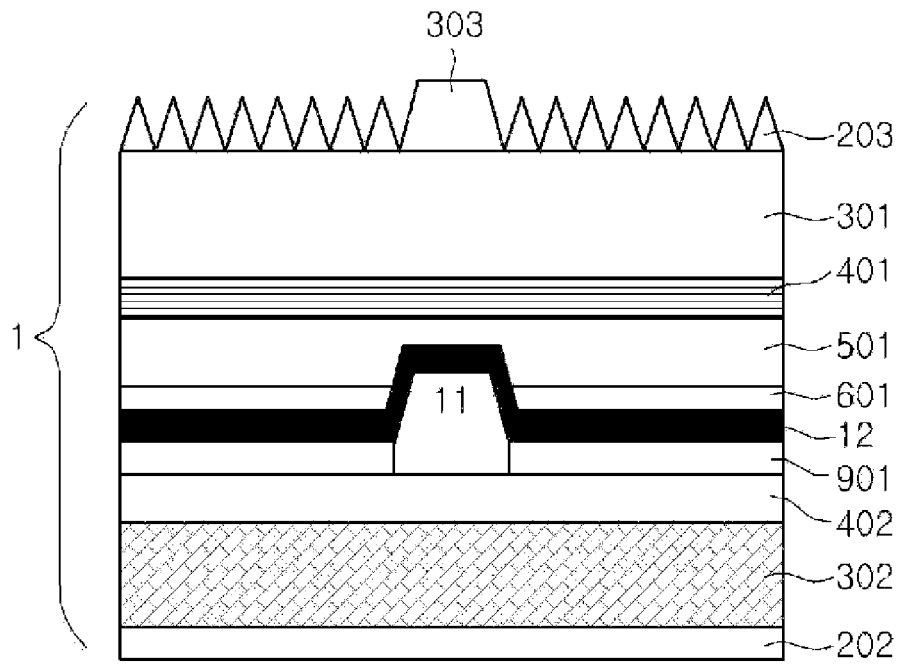
FIG. 1 is a diagram describing a light emitting element according to a first exemplary embodiment.

In describing embodiments of the present invention, it will be understood that when layers (films), regions, patterns, or structures are referred to as being "on" or "under" a substrate, layers (films), regions, pads, or patterns, "on" and "under" include "directly" or "indirectly". Further, "on" or "under" will be described on the basis of the drawings.

In the drawings, thicknesses or sizes of layers are exaggerated, omitted, or schematically illustrated for convenience and clarity of description. Further, sizes and actual sizes of constituent members are not fully reflected.

Hereinafter, a light emitting element and a manufacturing method thereof according to exemplary embodiments will be described in detail with reference to the accompanying drawings.

FIG. 1 is a diagram describing a light emitting element according to a first exemplary embodiment.

The light emitting element 1 according to the first exemplary embodiment includes a support substrate 302, a current blocking region 11 formed on the support substrate 302, a second electrode layer 12 formed on the support substrate 302 and the current blocking region 11, a current spreading layer 601 formed on the second electrode layer 12, a second conductive semiconductor layer 501 formed on the second electrode layer 12 and the current spreading layer 601, an active layer 401 formed on the second conductive semiconductor layer 501, a first conductive semiconductor layer 301 formed on the active layer 401, and a first electrode layer 303 formed on the first conductive semiconductor layer 301.

A light extraction structure 203 is formed on the first conductive semiconductor layer 301 so as to effectively emit light emitted from the active layer 401 to the outside. For example, the light extraction structure 203 may be formed in a pattern in which the first conductive semiconductor layer 301 is selectively etched or in a pattern in which a nitride layer without an impurity is selectively etched.

The first electrode layer 303 ohmic-contacts the first conductive semiconductor layer 301.

The fist conductive semiconductor layer 301 may be formed by a gallium nitride layer containing n-type impurities and the second conductive semiconductor layer 501 may be formed by a gallium nitride layer containing p-type impurities. Further, the active layer 401, which is the layer that generates light through the recombination of electrons and holes, may be formed by a gallium nitride layer or a gallium nitride layer containing indium.

The current spreading layer 601 is formed below the second conductive semiconductor layer 501 and has an ohmic contacting interface with the second conductive semiconductor layer 501. Since the current spreading layer 601 is excellent in vertical current injecting and has low surface resistance, it is formed by an electroconductive thin film which is excellent in horizontal current spreading.

The current spreading layer 601 is made of a transparent material that transmits most of light generated from the active layer 401 and for example, it may be made of at least one of indium tin oxide (ITO), indium zinc oxide (IZO), zinc oxide (ZnO), and oxidized nickel-gold (NiO—Au).

The second electrode layer 12 may be formed by a single layer or multilayers that are made by metal, an alloy, or a solid solution which has high reflectance, prevents a material from being spread, and has strong adhesive power.

The second electrode layer 12 contacts the current spreading layer 601 and the second conductive semiconductor layer 501. The second electrode layer 12 which contacts the second conductive semiconductor layer 501 forms a schottky contacting interface and the second electrode layer 12 which contacts the current spreading layer 601 forms the ohmic contacting interface.

The part of the second electrode layer 12 which forms the schottky contacting interface may be at least partially overlapped with the first electrode layer 303 in a vertical direction. Since current does not well flow through the schottky contacting interface and current generally flows through the ohmic contacting interface, current spreads and flows to a large area in the light emitting element 1. Accordingly, the light efficiency of the light emitting element 1 may be increased.

Although the part of the second electrode layer 12 which forms the schottky contacting interface is formed at only a position where it is vertically overlapped with the first electrode layer 303, the part of the second electrode layer 12 which forms the schottky contacting interface, that is, a part which contacts the second conducive semiconductor layer 501 may be formed at a plurality of locations.

Meanwhile, the current blocking region 11 is formed below the part of the second electrode layer 12 which forms the schottky contacting interface. The current blocking region 11 blocks the flow of current similarly as the schottky contacting interface, as a result, current spreads and flows to a large area in the light emitting element 1.

The current blocking region 11 may be formed by burying an electric insulating material or by an air gap.

A first wafer bonding layer 402 and a second wafer bonding layer 901 are formed between the second electrode layer 12 and the support substrate 302. The first wafer bonding layer 402 and the second wafer bonding layer 901 are formed by an electroconductive material layer that has strong bonding power under predetermined pressure and temperature and for example, it may include at least one of Au, Ag, Al, Rh, Cu, Ni, Ti, Pd, Pt, and Cr. The first wafer bonding layer 402 and the second wafer bonding layer 901 allow the second electrode layer 12 and the support substrate 32 to be rigidly bonded to each other.

The current blocking region 11 is surrounded by the second electrode layer 12, the first wafer bonding layer 402, and the second wafer bonding layer 901. That is, the bottom of the current blocking region 11 contacts the first wafer bonding layer 402, the side of the current blocking region 11 contacts the second wafer bonding layer 901, and the side and top of the current blocking region 11 contact the second electrode layer 12. At least a part of the side of the current blocking region 11 may be formed by an inclined surface.

The support substrate 302 which is made of the electroconductive material layer may be formed in at least 10 mm or more by electro-plating, physical vapor deposition (PVD), and chemical vapor deposition (CVD) methods.

A die bonding layer 202 may be formed below the support substrate 302. The die bonding layer 202 allows the light emitting element 1 to be rigidly bonded to a circuit substrate or a die on which the light emitting element 1 is installed with low resistance.

Figure 2:
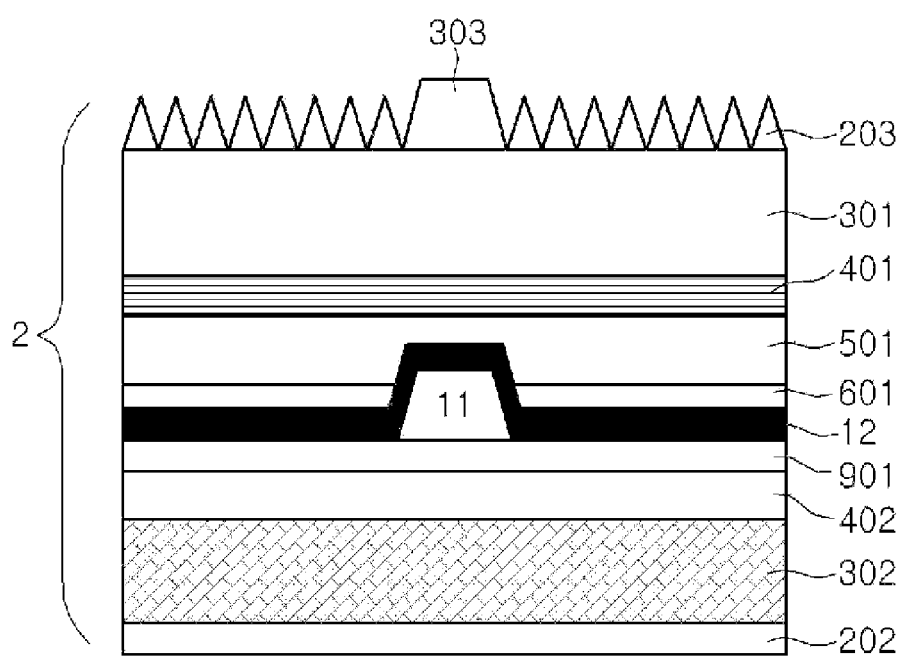
FIG. 2 is a diagram describing a light emitting element according to a second exemplary embodiment.

FIG. 2 is a diagram describing a light emitting element according to a second exemplary embodiment.

The light emitting element 2 according to the second exemplary embodiment has a similar structure as the light emitting element 1 according to the first exemplary embodiment. Therefore, in describing the light emitting element 2 according to the second exemplary embodiment, the description of the light emitting element 1 according to the first exemplary embodiment and duplicated description will be omitted.

In the light emitting element 2 according to the second exemplary embodiment, the current blocking region 11 is surrounded by the second electrode layer 12 and the second wafer bonding layer 901. That is, the bottom of the current blocking region 11 contacts the second wafer bonding layer 901 and the side and top of the current blocking region 11 contact the second electrode layer 12.

Figure 3:
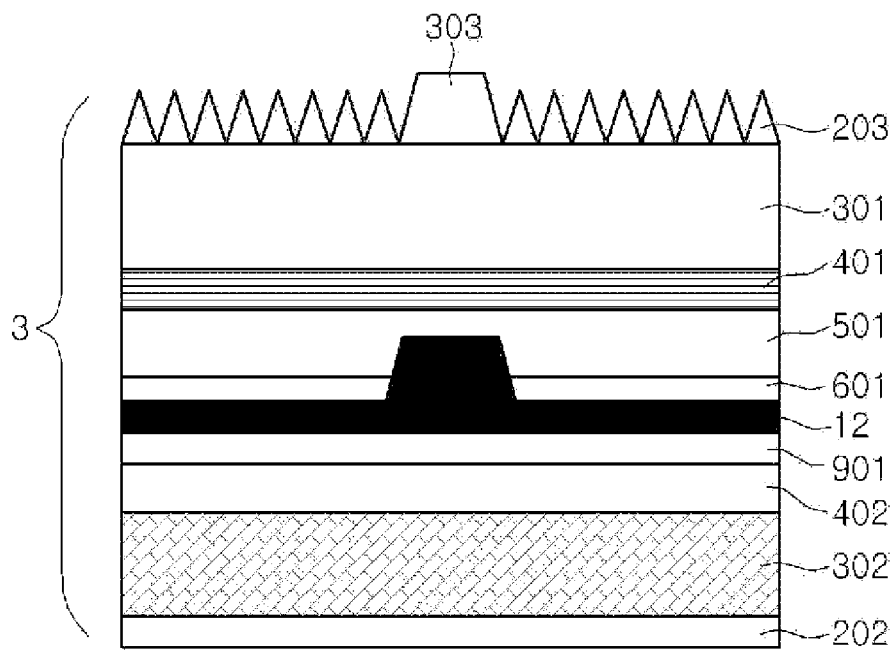
FIG. 3 is a diagram describing a light emitting element according to a third exemplary embodiment.

FIG. 3 is a diagram describing a light emitting element according to a third exemplary embodiment.

The light emitting element 3 according to the third exemplary embodiment has a similar structure as the light emitting element 2 according to the second exemplary embodiment. Therefore, in describing the light emitting element 3 according to the third exemplary embodiment, the description of the light emitting element 2 according to the second exemplary embodiment and duplicated description will be omitted.

In the light emitting element 3 according to the third exemplary embodiment, a current blocking region 11 is not formed and the second electrode layer 12 is buried.

The bottom of the second electrode layer 12 is flat and the entire bottom of the second electrode layer contacts the second bonding layer 901.

Figure 4:
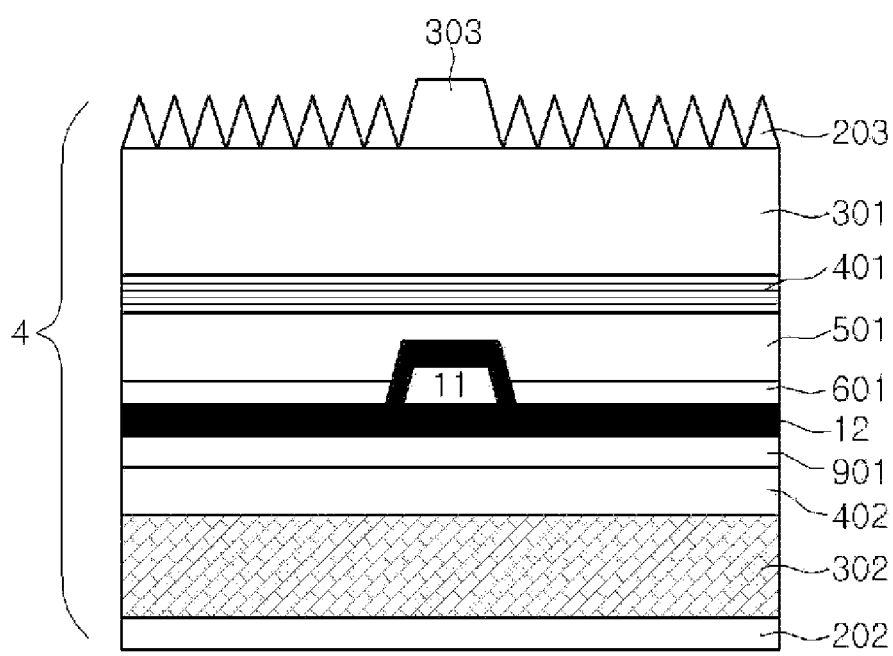
FIG. 4 is a diagram describing a light emitting element according to a fourth exemplary embodiment.

FIG. 4 is a diagram describing a light emitting element according to a fourth exemplary embodiment.

The light emitting element 4 according to the fourth exemplary embodiment has a similar structure as the light emitting element 2 according to the second exemplary embodiment. Therefore, in describing the light emitting element 4 according to the fourth exemplary embodiment, the description of the light emitting element 2 according to the second exemplary embodiment and duplicated description will be omitted.

In the light emitting element 4 according to the fourth exemplary embodiment, the current blocking region 11 is surrounded by the second electrode layer 12. That is, the bottom, side, and top of the current blocking region 11 contact the second electrode layer 12.

Figure 5:
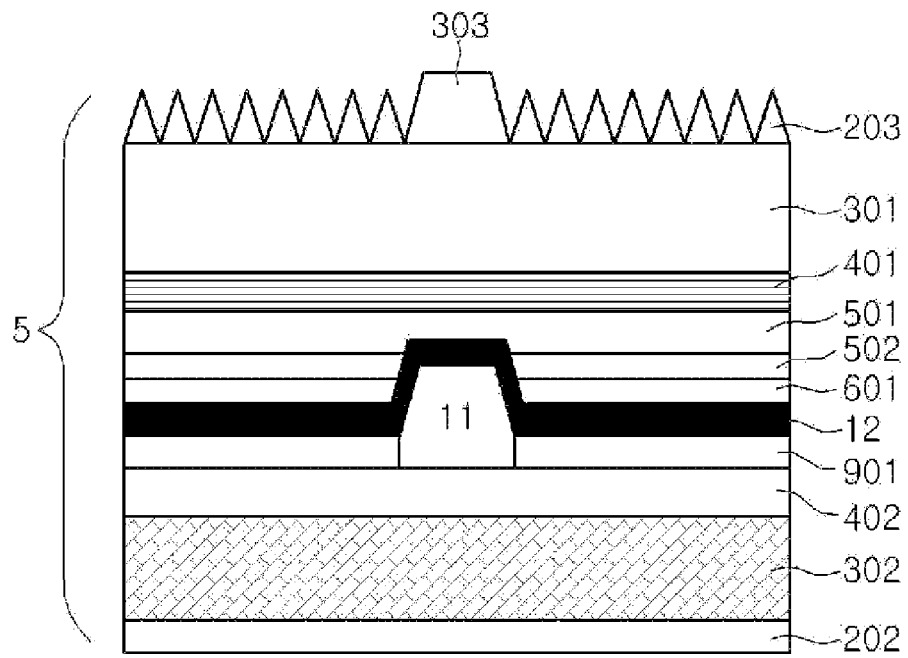
FIG. 5 is a diagram describing a light emitting element according to a fifth exemplary embodiment.

FIG. 5 is a diagram describing a light emitting element according to a fifth exemplary embodiment.

The light emitting element 5 according to the fifth exemplary embodiment has a similar structure as the light emitting element 1 according to the first exemplary embodiment. Therefore, in describing the light emitting element 5 according to the fifth exemplary embodiment, the description of the light emitting element 1 according to the first exemplary embodiment and duplicated description will be omitted.

In the light emitting element 5 according to the fifth exemplary embodiment, an interface reforming layer 502 is formed between the second conductive semiconductor layer 501 and the current spreading layer 601. The interface reforming layer 502 has a superlattice structure and may be made of any one of InGaN, GaN, AlInN, AlN, InN, and AlGaN that are injected with first conductive impurities, any one of InGaN, GaN, AlInN, AlN, InN, and AlGaN that are injected with second conductive impurities, or any one of III-group nitride based materials having a nitrogen-polar surface.

In particular, the interface reforming layer 502 having the superlattice structure may be made of nitride or carbon nitride containing II-group, III-group, or IV-group elements.

The interface reforming layer 502 has the ohmic contacting interface with the current spreading layer 601 and the second conductive semiconductor layer 501.

The top of the second electrode layer 12 contacts the current spreading layer 601, the interface reforming layer 502, and the second conductive semiconductor layer 501. The second electrode layer 12 has the ohmic contacting interface with the current spreading layer 601 and the interface reforming layer 502 and has the schottky contacting interface with the second conductive semiconductor layer 501.

Figure 6:
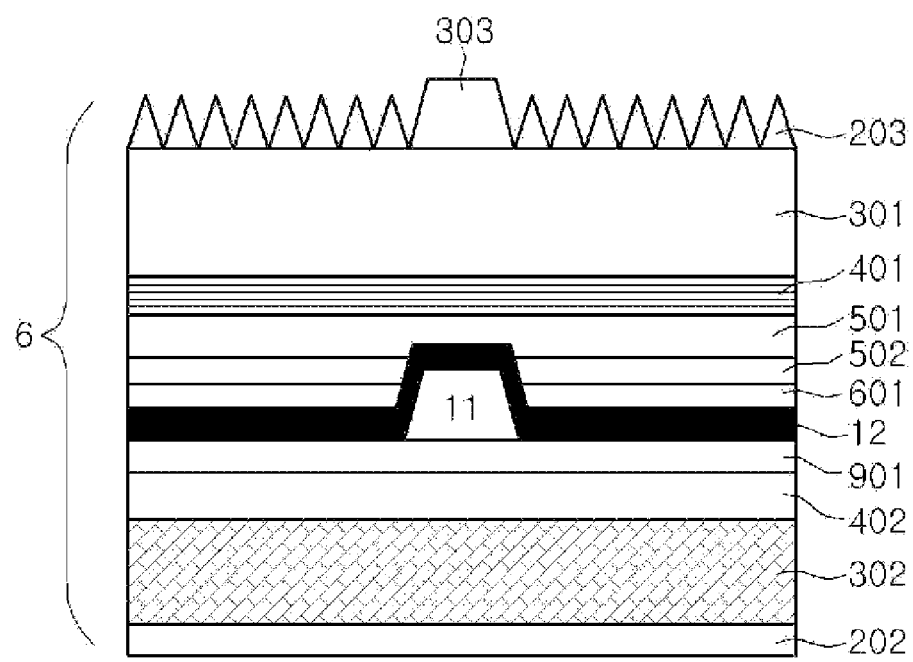
FIG. 6 is a diagram describing a light emitting element according to a sixth exemplary embodiment.

FIG. 6 is a diagram describing a light emitting element according to a sixth exemplary embodiment.

The light emitting element 6 according to the sixth exemplary embodiment has a similar structure as the light emitting element 2 according to the second exemplary embodiment. Therefore, in describing the light emitting element 6 according to the sixth exemplary embodiment, the description of the light emitting element 2 according to the second exemplary embodiment and duplicated description will be omitted.

The light emitting element 6 according to the sixth exemplary embodiment has the similar structure as the light emitting element 2 according to the second exemplary embodiment. However, the interface reforming layer 502 described in the fifth exemplary embodiment is formed between the current spreading layer 601 and the second conductive semiconductor layer 501.

Figure 7:
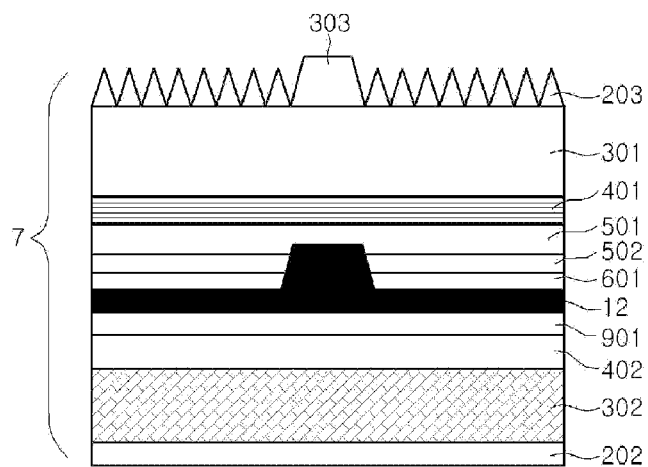
FIG. 7 is a diagram describing a light emitting element according to a seventh exemplary embodiment.

FIG. 7 is a diagram describing a light emitting element according to a seventh exemplary embodiment.

The light emitting element 7 according to the seventh exemplary embodiment has a similar structure as the light emitting element 3 according to the third exemplary embodiment. Therefore, in describing the light emitting element 7 according to the seventh exemplary embodiment, the description of the light emitting element 3 according to the third exemplary embodiment and duplicated description will be omitted.

The light emitting element 7 according to the seventh exemplary embodiment has the similar structure as the light emitting element 3 according to the third exemplary embodiment. However, the interface reforming layer 502 described in the fifth exemplary embodiment is formed between the current spreading layer 601 and the second conductive semiconductor layer 501.

Figure 8:
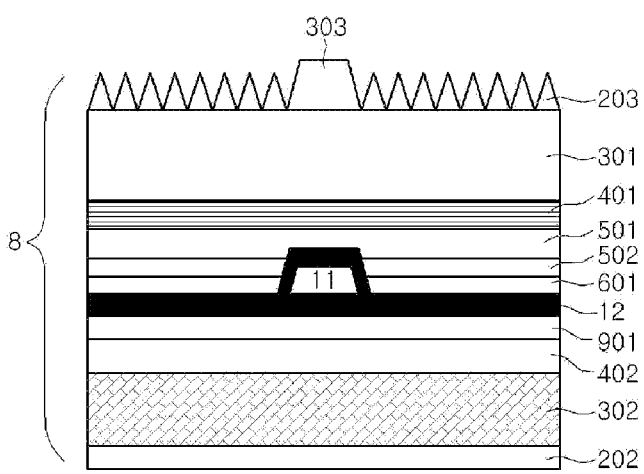
FIG. 8 is a diagram describing a light emitting element according to an eighth exemplary embodiment.

FIG. 8 is a diagram describing a light emitting element according to an eighth exemplary embodiment.

The light emitting element 8 according to the eighth exemplary embodiment has a similar structure as the light emitting element 4 according to the fourth exemplary embodiment. Therefore, in describing the light emitting element 8 according to the eighth exemplary embodiment, the description of the light emitting element 4 according to the fourth exemplary embodiment and duplicated description will be omitted.

The light emitting element 8 according to the seventh exemplary embodiment has the similar structure as the light emitting element 4 according to the fourth exemplary embodiment. However, the interface reforming layer 502 described in the fifth exemplary embodiment is formed between the current spreading layer 601 and the second conductive semiconductor layer 501.

FIGS. 9 to 17 are diagrams describing a manufacturing method of a light emitting element according to an exemplary embodiment.

The manufacturing method of the light emitting element according to the first exemplary embodiment is shown in FIGS. 9 to 17. Only a difference between the manufacturing methods of the light emitting elements according to the second to seventh exemplary embodiments and the manufacturing method of the light emitting element according to the first exemplary embodiment will be described.

Figure 9:
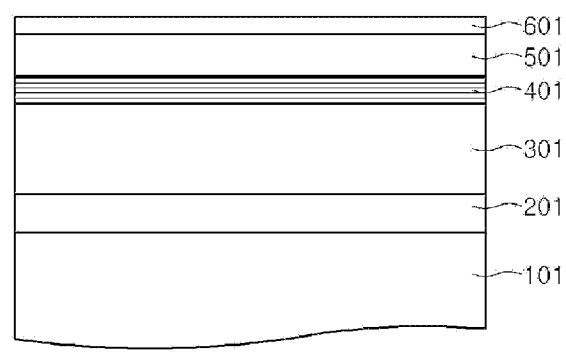
FIGS. 9 to 17 are diagrams describing a manufacturing method of a light emitting element according to an exemplary embodiment.

Referring to FIG. 9, a first conductive semiconductor layer 301, an active layer 401, a second conductive semiconductor layer 501, and a current spreading layer 601 are formed on a growth substrate 101.

For example, the first conductive semiconductor layer 301 may be formed by a GaN layer or an AlGaN layer containing n-type impurities, the second conductive semiconductor layer 501 may be formed by a GaN layer or an AlGaN layer containing p-type impurities, and the active layer 401 may be formed an undoped InGaN layer having a multi-quantum well structure.

The first conductive semiconductor layer 301, the active layer 401, and the second conductive semiconductor layer 501 may be formed by an MOCVD or MBE single crystal growth method.

Meanwhile, prior to growing the first conductive semiconductor layer 301 on the growth substrate 101, a buffer layer 201 containing at least one of, for example, InGaN, AlN, SiC, SiCN, and GaN may be formed on the growth substrate 101.

The current spreading layer 601 is formed by growing the second conductive semiconductor layer 501 and thereafter, and material deposition and heat treatment.

The current spreading layer 601 has an ohmic contacting interface with the second conductive semiconductor layer 501 and is formed by an electroconductive thin film which is excellent in vertical current injecting and horizontal current spreading.

The current spreading layer 601 is made of a transparent material that transmits most of light generated from the active layer 401 and for example, it may be made of at least one of indium tin oxide (ITO), indium zinc oxide (IZO), zinc oxide (ZnO), and oxidized nickel-gold (NiO—Au).

Figure 10:
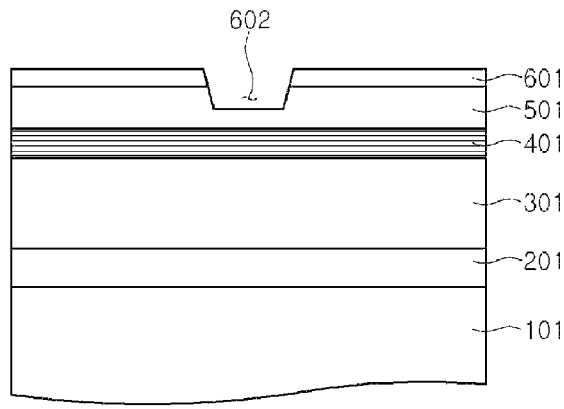

Referring to FIG. 10, an etch groove 602 is formed by selectively the current spreading layer 601 and the second conductive semiconductor layer 501 to expose the second conductive semiconductor layer 501. The etch groove 602 may be formed in a trench form.

Figure 11:
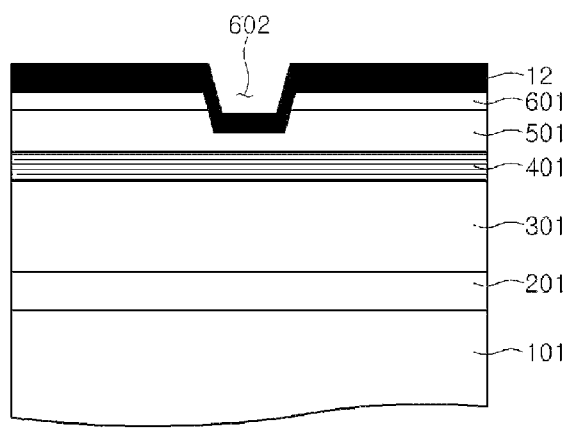

Referring to FIG. 11, a second electrode layer 12 is formed on the current spreading layer 601 and the etch groove 602. In this case, even though the second electrode layer 12 is formed on an inner wall of the etch groove 602 to form the second electrode layer 12, the etch groove 602 is provided.

The second electrode layer 12 has the ohmic contacting interface with the current spreading layer 601 and has a schottky contacting interface with the second conductive semiconductor layer 501.

Figure 12:
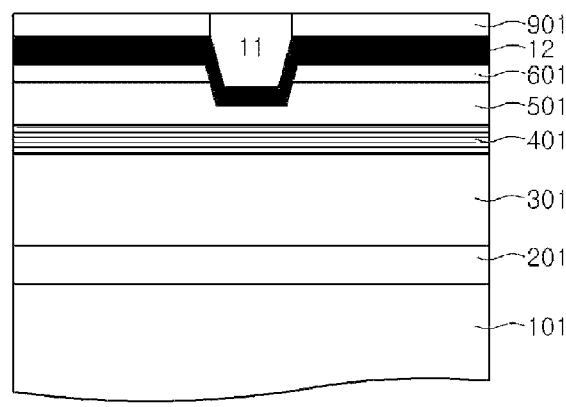

Referring to FIG. 12, a second wafer bonding layer 901 is partially formed to expose the etch groove 602 and a current blocking region 11 is formed in the etch groove 602.

The current blocking region 11 may be formed by burying an electric insulating material or by only an air gap without burying the electric insulating material.

Figure 13:
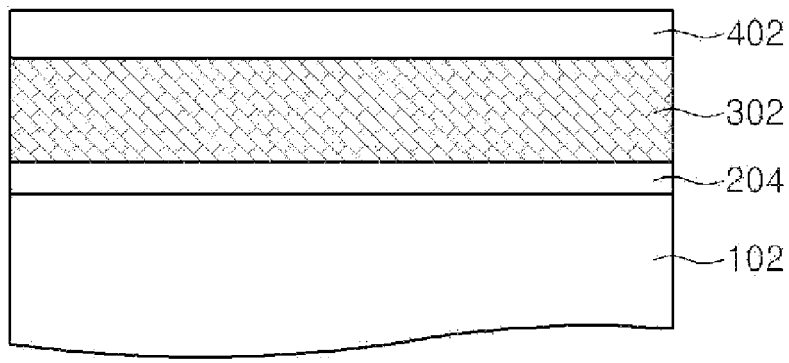

Referring to FIG. 13, a sacrificial separation layer 204, a support substrate 302, and a first wafer bonding layer 402 are formed on a temporary substrate 102.

The temporary substrate 102 is made of a material having the same or similar thermal expansion coefficient as the growth substrate 101. For example, if a sapphire substrate is used as the growth substrate 101, the sapphire substrate may also be used as the temporary substrate 102.

The sacrificial separation layer 204 may be made of a material which can be removed by chemical-mechanical polishing (CMP), chemical wet etching, and material decomposition using a photon beam of a predetermined wavelength band and for example, it may be made of at least one of ZnO, GaN, InGaN, InN, ITO, AlInN, AlGaN, ZnInN, ZnGaN, MgGaN, Au, Ag, Pd, $SiO_2$, and $SiN_x$.

The support substrate 302 may be formed in a single-layer structure or a multilayer structure containing metal, an alloy, and solid solution and may be formed by at least one of an electroplating method having high deposition rate, a physical vapor deposition (PVD) method, and a chemical vapor deposition (CVD) method.

Figure 14:
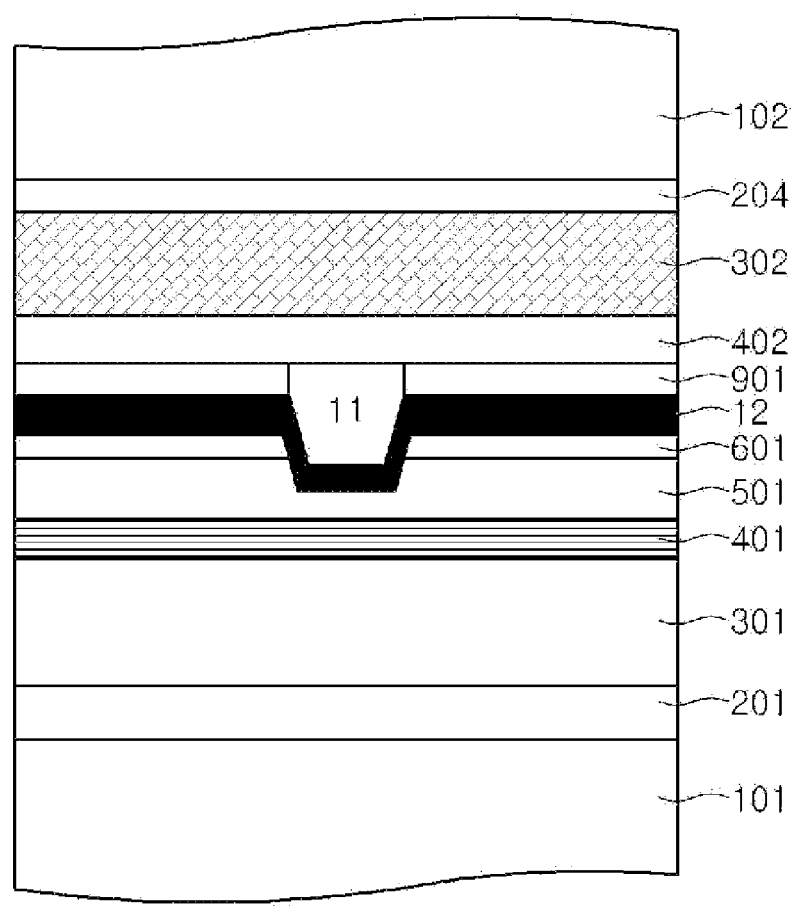

Referring to FIG. 14, the first wafer bonding layer 402 and the second wafer bonding layer 901 are bonded to each other to acquire a composite formed by bonding the structure shown in FIG. 12 and the structure shown in FIG. 13.

The first wafer bonding layer 402 and the second wafer bonding layer 901 are bonded to each other by applying external hydrostatic pressure at root temperature or temperature of 700° C. or lower and under vacuum, oxygen, argon, or nitrogen gas atmosphere.

Further, a surface treatment process and a heat treatment process may be performed in order to form the mechanical bonding power and ohmic contacting interface between the first wafer bonding layer 402 and the second wafer bonding layer 901.

Figure 15:
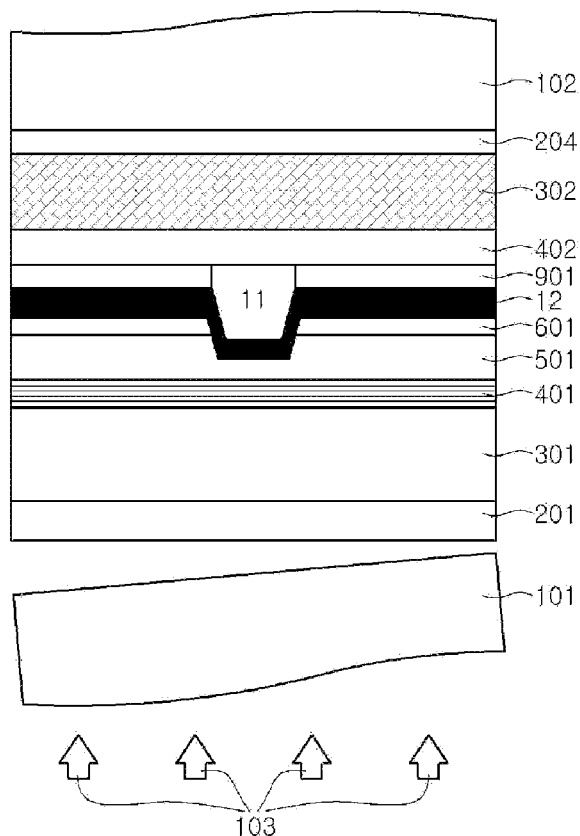

Referring to FIG. 15, the growth substrate 101 is separated by irradiating a photon beam.

The buffer layer 201 is separated by irradiating the photo beam 103 to the growth substrate 101 to thereby separate the growth substrate 101. When a transparent substrate such as a sapphire substrate or an AlN substrate is used as the growth substrate 101, the photon beam 103 penetrates the growth substrate 101 and thereafter, is absorbed in the buffer layer 201 and a thermochemical decomposition reaction is generated in the buffer layer 201 to separate the growth substrate 101 from the composite.

Figure 16:
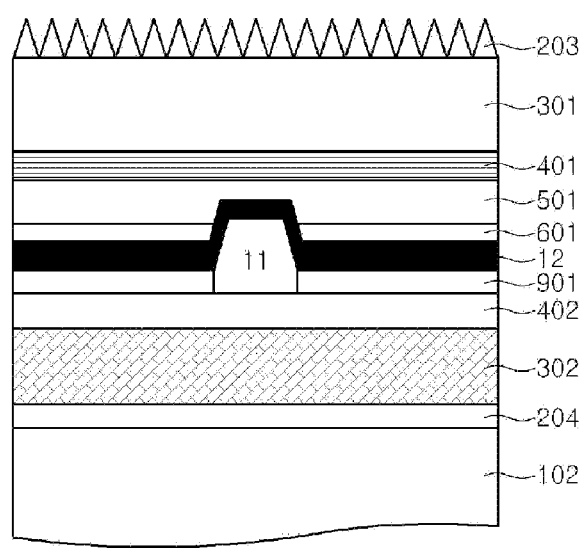

Referring to FIG. 16, after the growth substrate 101 is removed, a light extraction structure 203 is formed on the first conductive semiconductor layer 301. Unevenesses or patterns are generated on a surface by removing the first conductive semiconductor layer 301 through a wet etching or dry etching method to form the light extraction structure 203.

Figure 17:
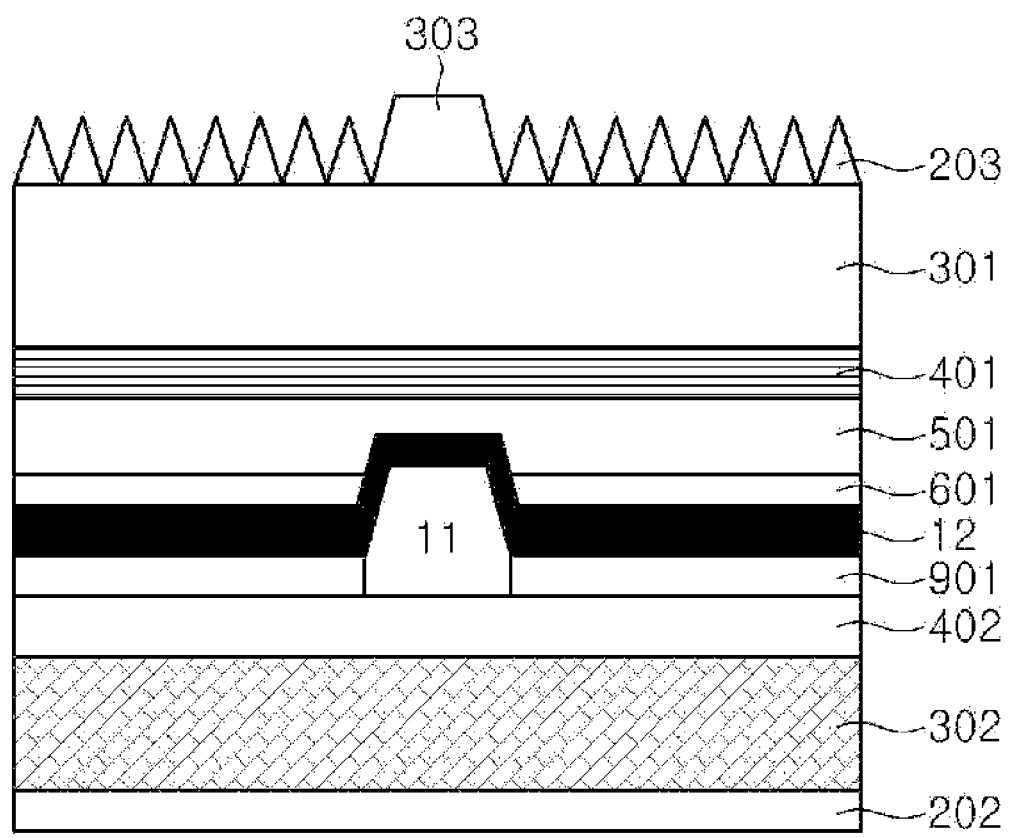

Referring to FIG. 17, a first electrode layer 303 is formed on the first conductive semiconductor layer 301. The first electrode layer 303 may be formed at a position where it is vertically overlapped with the current blocking region 11.

Thereafter, like the growth substrate 101, the sacrificial separation layer 204 is decomposed through the thermochemical decomposition reaction by irradiating the photon beam even to the temporary substrate 102 to separate the temporary substrate 102 from the composite.

In addition, a die bonding layer 202 is formed below the support substrate 302.

Accordingly, the light emitting element according to the first exemplary embodiment may be manufactured.

Meanwhile, the manufacturing methods according to the second to fourth exemplary embodiments are similar as the manufacturing method of the light emitting element according to the first exemplary embodiment. Therefore, only the difference from the manufacturing method of the light emitting element according to the first exemplary embodiment will be described.

In the manufacturing method of the light emitting element according to the second exemplary embodiment, as shown in FIG. 11, the second electrode layer 12 is formed and thereafter, the current blocking region 11 is formed in an etch groove 602. In addition, the second wafer bonding layer 901 is formed on the second electrode layer 12 and the current blocking region 11.

In the manufacturing method of the light emitting element according to the third exemplary embodiment, as shown in FIG. 11, when the second electrode layer 12 is formed, the second electrode layer 12 is fully buried in the etch groove 602. In addition, the second wafer bonding layer 901 is formed on the second electrode layer 12.

In the manufacturing method of the light emitting element according to the fourth exemplary embodiment, as shown in FIG. 11, the second electrode layer 12 is formed and thereafter, the current blocking region 11 is formed in the etch groove 602. In addition, the second electrode layer 12 is formed on the second electrode layer 12 and the current blocking region 11 to cause the current blocking region 11 to be surrounded by the second electrode layer 12.

Alternately, the second electrode layer 12 is formed on an inner surface of the etch groove 602, the current blocking region 11 is formed on the second electrode layer 12 in the etch groove 602, and the second electrode layer 12 is again formed on the current spreading layer 601 and the current blocking region 11.

The manufacturing method of the light emitting element according to the fifth exemplary embodiment is similar as the manufacturing method of the light emitting element according to the first exemplary embodiment. Therefore, only the difference from the manufacturing method of the light emitting element according to the first exemplary embodiment will be described.

As shown in FIG. 9, before the current spreading layer 601 is formed, the interface reforming layer 502 is formed on the second conductive semiconductor layer 501. In addition, as shown in FIG. 10, when the etch groove 602 is formed, the second conductive semiconductor layer 501 is exposed by selectively etching the current spreading layer 601, the interface reforming layer 502, and the second conductive semiconductor layer 501.

The manufacturing method of the light emitting element according to the sixth exemplary embodiment is similar as the manufacturing method of the light emitting element according to the second exemplary embodiment. Therefore, only the difference from the manufacturing method of the light emitting element according to the second exemplary embodiment will be described.

As shown in FIG. 9, before the current spreading layer 601 is formed, the interface reforming layer 502 is formed on the second conductive semiconductor layer 501. In addition, as shown in FIG. 10, when the etch groove 602 is formed, the second conductive semiconductor layer 501 is exposed by selectively etching the current spreading layer 601, the interface reforming layer 502, and the second conductive semiconductor layer 501.

The manufacturing method of the light emitting element according to the seventh exemplary embodiment is similar as the manufacturing method of the light emitting element according to the third exemplary embodiment. Therefore, only the difference from the manufacturing method of the light emitting element according to the third exemplary embodiment will be described.

As shown in FIG. 9, before the current spreading layer 601 is formed, the interface reforming layer 502 is formed on the second conductive semiconductor layer 501. In addition, as shown in FIG. 10, when the etch groove 602 is formed, the second conductive semiconductor layer 501 is exposed by selectively etching the current spreading layer 601, the interface reforming layer 502, and the second conductive semiconductor layer 501.

The manufacturing method of the light emitting element according to the eighth exemplary embodiment is similar as the manufacturing method of the light emitting element according to the fourth exemplary embodiment. Therefore, only the difference from the manufacturing method of the light emitting element according to the fourth exemplary embodiment will be described.

As shown in FIG. 9, before the current spreading layer 601 is formed, the interface reforming layer 502 is formed on the second conductive semiconductor layer 501. In addition, as shown in FIG. 10, when the etch groove 602 is formed, the second conductive semiconductor layer 501 is exposed by selectively etching the current spreading layer 601, the interface reforming layer 502, and the second conductive semiconductor layer 501.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. For example, components specifically described in the embodiment of the present invention can be modified. In addition, it should be appreciated that differences related to the modification and application fall within the scope of the present invention, which is prescribed in the appended claims.

INDUSTRIAL APPLICABILITY

Exemplary embodiments can be applied to a light emitting element.

The invention claimed is:

1. A light emitting element, comprising:
a support substrate;
a second electrode layer formed on the support substrate;
a current spreading layer formed on the support substrate;
a second conductive semiconductor layer formed on the second electrode layer and the current spreading layer;
an active layer formed on the second conductive semiconductor layer;
a first conductive semiconductor layer formed on the active layer; and
a first electrode layer formed on the first conductive semiconductor layer,
wherein the second electrode layer has an ohmic contacting interface with the current spreading layer and has a schottky contacting interface with the second conductive semiconductor layer.

2. The light emitting element of claim 1, further comprising a wafer bonding layer between the support substrate and the second electrode layer.

3. The light emitting element of claim 1, wherein the second electrode layer contacts the current spreading layer and the second conductive semiconductor layer.

4. The light emitting element of claim 1, wherein a part of the second electrode layer having the schottky contacting interface with the second conductive semiconductor layer is at least partially overlapped with the first electrode layer in a vertical direction.

5. The light emitting element of claim 1, further comprising a current blocking region between the support substrate and the second electrode layer.

6. The light emitting element of claim 1, further comprising an interface reforming layer between the current spreading layer and the second conductive semiconductor layer.

7. The light emitting element of claim 1, wherein the current spreading layer is made of at least one of indium tin oxide (ITO), indium zinc oxide (IZO), zinc oxide (ZnO), and oxidized nickel-gold (NiO—Au).

8. The light emitting element of claim 1, further comprising a light extraction structure disposed on the first conductive semiconductor layer.

9. The light emitting element of claim 2, wherein the wafer bonding layer has a first wafer bonding layer and a second bonding layer.

10. The light emitting element of claim 5, wherein the current blocking region is formed by burying an electroconductive material or by an air gap.

11. The light emitting element of claim 5, wherein at least a part of the current blocking region is vertically overlapped with the first electrode layer.

12. The light emitting element of claim 5, wherein the current blocking region is surrounded by the second electrode layer and the wafer bonding layer.

13. The light emitting element of claim 5, wherein the current blocking region is surrounded by the second electrode layer.

14. The light emitting element of claim 6, wherein the interface reforming layer has a superlattice structure and is made of any one of InGaN, GaN, AlInN, AlN, InN, and AlGaN that are injected with first conductive impurities, any one of InGaN, GaN, AlInN, AlN, InN, and AlGaN that are injected with second conductive impurities, or any one of III-group nitride based materials having a nitrogen-polar surface.

15. The light emitting element of claim 6, wherein the second electrode layer contacts the current spreading layer, the interface reforming layer, and the second conductive semiconductor layer.

16. The light emitting element of claim 14, wherein in the case in which the interface reforming layer has the superlattice structure, the interface reforming layer is made of nitride or carbon nitride containing II-group, III-group, or IV-group elements.

* * * * *